United States Patent
Ko et al.

(10) Patent No.: US 12,394,654 B2
(45) Date of Patent: Aug. 19, 2025

(54) WAFER TYPE SENSOR, WAFER ALIGNMENT METHOD USING THE SAME, AND CALIBRATION DEVICE FOR CALIBRATING WAFER TYPE SENSOR

(71) Applicant: SAMSUNG ELECTRONICS CO., LTD., Suwon-si (KR)

(72) Inventors: Byung Hoon Ko, Suwon-si (KR); Seung Woo Noh, Suwon-si (KR); Sang Yun Park, Suwon-si (KR); Jin Woo Choi, Suwon-si (KR); Youn Ho Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 226 days.

(21) Appl. No.: 18/081,102

(22) Filed: Dec. 14, 2022

(65) Prior Publication Data
US 2024/0030054 A1 Jan. 25, 2024

(30) Foreign Application Priority Data
Jul. 21, 2022 (KR) .......................... 10-2022-0090124

(51) Int. Cl.
*H01L 21/68* (2006.01)
*G01B 11/14* (2006.01)
(Continued)

(52) U.S. Cl.
CPC .............. *H01L 21/68* (2013.01); *G01B 11/14* (2013.01); *H01L 21/67259* (2013.01);
(Continued)

(58) Field of Classification Search
CPC .............. H01L 21/68; H01L 21/67259; H01L 21/68707; H01L 21/681; H01L 21/67742;
(Continued)

(56) References Cited

U.S. PATENT DOCUMENTS 4,475,122 A  10/1984  Green
4,819,167 A   4/1989  Cheng et al.
(Continued)

FOREIGN PATENT DOCUMENTS

CN  103801823 A  5/2014
JP    2949528 B2  9/1999
(Continued)

OTHER PUBLICATIONS

Communication dated Jun. 29, 2023, issued by the European Patent Office in counterpart European Application No. 23151581.8.
(Continued)

*Primary Examiner* — Michelle M Iacoletti
*Assistant Examiner* — Judy Dao Tran
(74) *Attorney, Agent, or Firm* — Sughrue Mion, PLLC

(57) ABSTRACT

A wafer-type sensor for wafer alignment includes a dummy wafer; a sensor module disposed in the dummy wafer, and a processor configured to control the sensor module to measure a distance between a side surface of the dummy wafer and a ring formed around a periphery of an electrostatic chuck based on the dummy wafer being mounted on the electrostatic chuck by a transfer robot.

18 Claims, 13 Drawing Sheets

(51) Int. Cl.
  *H01L 21/67* (2006.01)
  *H01L 21/687* (2006.01)
  *G01B 7/14* (2006.01)
  *G12B 9/02* (2006.01)

(52) U.S. Cl.
  CPC .......... *H01L 21/68707* (2013.01); *G01B 7/14* (2013.01); *G12B 9/02* (2013.01)

(58) Field of Classification Search
  CPC .......... G01B 11/14; G01B 7/14; G01B 11/02; G01B 11/026; G12B 9/02
  See application file for complete search history.

(56) References Cited

U.S. PATENT DOCUMENTS

| | | | |
|---|---|---|---|
| 5,264,918 A | | 11/1993 | Kagami |
| 6,293,696 B1 | * | 9/2001 | Guardado ............ G01J 5/0003 250/252.1 |
| 7,123,362 B2 | | 10/2006 | Ban |
| 7,387,484 B2 | * | 6/2008 | Ho .................... H01L 21/67748 414/217 |
| 8,224,607 B2 | | 7/2012 | Sakhare et al. |
| 8,253,948 B2 | | 8/2012 | Kiley et al. |
| 8,688,398 B2 | | 4/2014 | Sakhare et al. |
| 10,847,393 B2 | | 11/2020 | Potter et al. |
| 11,387,122 B2 | | 7/2022 | Potter et al. |
| 2006/0092990 A1 | * | 5/2006 | Koga ................... B23K 26/04 372/7 |
| 2018/0366358 A1 | | 12/2018 | Shin et al. |
| 2020/0075367 A1 | | 3/2020 | Potter et al. |
| 2020/0075370 A1 | | 3/2020 | Potter et al. |
| 2021/0172728 A1 | | 6/2021 | Waqar et al. |
| 2021/0280442 A1 | | 9/2021 | Kim et al. |
| 2022/0254666 A1 | * | 8/2022 | Sadeghi ............ H01L 21/68742 |
| 2024/0385225 A1 | * | 11/2024 | Masui .................... G01R 15/22 |

FOREIGN PATENT DOCUMENTS

| | | |
|---|---|---|
| KR | 10-2001-0026895 A | 4/2001 |
| KR | 10-0650814 B1 | 11/2006 |
| KR | 10-2009-0023314 A | 3/2009 |
| KR | 10-2009-0095837 A | 9/2009 |
| KR | 10-2018-0136137 A | 12/2018 |
| KR | 10-2020-0072689 A | 6/2020 |
| KR | 10-2021-0013345 A | 2/2021 |
| KR | 10-2309136 B1 | 10/2021 |
| KR | 10-2022-0062186 A | 5/2022 |

OTHER PUBLICATIONS

Communication issued on Apr. 11, 2024 by the Korean Intellectual Property Office for Korean Patent Application No. 10-2022-0090124.

* cited by examiner

WAFER TYPE SENSOR, WAFER ALIGNMENT METHOD USING THE SAME, AND CALIBRATION DEVICE FOR CALIBRATING WAFER TYPE SENSOR

CROSS-REFERENCE TO RELATED APPLICATION(S)

This application claims priority from Korean Patent Application No. 10-2022-0090124, filed on Jul. 21, 2022, in the Korean Intellectual Property Office, the entire disclosure of which is incorporated herein by reference for all purposes.

BACKGROUND

1. Field

The present disclosure relates to wafer alignment technology. More particularly, the disclosure relates to a wafer-type sensor, a wafer alignment method, a calibration device for calibrating a wafer-type sensor and a wafer alignment device.

2. Description of the Related Art

Semiconductor substrate processing is typically performed by subjecting a substrate to a plurality of sequential processes to create devices, conductors and insulators on the substrate. Semiconductor manufacturing processes, such as the photolithography process, wafer probe and test, wafer mounting, dicing, etc., require highly precise alignment.

Generally, a wafer alignment technique is provided in the entire transfer system such that complexity of the entire system increases, and when an alignment system is added, it is required to change expensive semiconductor equipment/transfer system. In addition, a position determining system/alignment system using an image sensor requires a working distance to secure a field of view (FOV) having a predetermined size, and lighting is also required in order to acquire an image with an appropriate intensity. Further, the alignment system based on the image sensor is essentially required to be combined with an optical system, and thus is not suitable for use in an ultra-thin sensing system.

SUMMARY

According to an aspect of the disclosure, a wafer-type sensor includes a dummy wafer, a sensor module disposed in the dummy wafer, and a processor configured to control the sensor module to measure a distance between a side surface of the dummy wafer and a ring formed around a periphery of an electrostatic chuck based on the dummy wafer being mounted on the electrostatic chuck by a transfer robot.

The sensor module may include a light source configured to emit light to the ring, and a light receiver configured to detect light reflected from the ring.

A distance between the light source and the light receiver of the sensor module may be 500 μm to 1500 μm.

The sensor module may be provided in plurality to form a plurality of sensor modules, and the plurality of sensor modules may be disposed in the dummy wafer so that distances between the respective sensor modules and the ring are equal while the dummy wafer being is aligned.

Based on the dummy wafer being placed on the electrostatic chuck, the sensor module may be disposed so that a distance between the sensor module and the ring is in a predetermined range.

Based on the sensor module being provided in plurality to form a plurality of sensor modules, and the plurality of sensor modules may be arranged at equal distances along a circumference of the dummy wafer.

The processor may calculate a transfer control value for the transfer robot based on the measured distance.

The wafer-type sensor may further include a communication interface configured to transmit the calculated transfer control value to a robot control device for controlling the transfer robot.

Based on the wafer-type sensor being held in a calibration device, the processor may calibrate the sensor module by using a reflector provided in the calibration device.

The sensor module may be provided in plurality to form a plurality of sensor modules, the reflector may be provided in plurality to form a plurality of reflectors, and the processor may operate a light source of each of the plurality of sensor modules to emit light to a corresponding reflector of the plurality of reflectors, and calibrate the plurality of sensor modules so that light intensities detected by light receivers of the plurality of sensor modules are equal to each other.

The processor may adjust at least one of a current intensity or a duration of the light source so that the light intensities detected by the light receivers of the plurality of modules have one of an average value, a maximum value, and a minimum value of the detected light intensities, or a predefined reference value.

The wafer-type sensor may further include a storage configured to store at least one of a processing result of the processor and an operating condition of the sensor module.

The wafer-type sensor may further include a battery configured to supply power to the sensor module.

According to an embodiment of the present disclosure, a wafer alignment method using a wafer-type sensor including a dummy wafer includes measuring, by a sensor module disposed in the dummy wafer, a distance between a side surface of the dummy wafer and a ring formed around a periphery of an electrostatic chuck based on the dummy wafer being mounted on the electrostatic chuck by a transfer robot, and controlling the transfer robot based on the measured distance to align a wafer to be subsequently transferred.

The controlling of the transfer robot may include calculating a transfer control value for the transfer robot based on the measured distance, and transmitting the calculated transfer control value to a robot control device for controlling the transfer robot.

The method may further include, based on the wafer-type sensor being held in a calibration device, calibrating the sensor module by using a reflector provided in the calibration device.

The reflector may be provided in plurality to form a plurality of reflectors, and the calibrating of the sensor module may include, based on the sensor module is provided in plurality to form a plurality of sensor modules, operating a light source of each of the plurality of sensor modules to emit light to a corresponding reflector of the plurality of reflectors, detecting light by a light receiver of each of the plurality of sensor modules, and calibrating the plurality of sensor modules so that light intensities detected by light receivers of the plurality of sensor modules are equal to each other.

According to an embodiment of the present disclosure, a calibration device for calibrating a wafer-type sensor including a sensor module includes a housing having a side support part and a receiving space for receiving the wafer-type sensor, a reflector formed on a surface of the side support part of the housing that is opposite the sensor module, and a spacer coupled to the side support part of the housing, and the spacer is configured, based on the wafer-type sensor being mounted in the receiving space, to maintain a predetermined distance from a side surface of a dummy wafer of the wafer-type sensor to the reflector.

The calibration device may further include a charger disposed in the housing and configured to charge a battery of the wafer-type sensor.

According to an embodiment of the present disclosure, a wafer alignment device includes a wafer-type sensor and a robot control device, and the wafer-type sensor includes a dummy wafer, a sensor module disposed in the dummy wafer and configured to measure a distance between a side surface of the dummy wafer and a ring formed around a periphery of an electrostatic chuck based on the dummy wafer being mounted on the electrostatic chuck by a transfer robot, and a communication interface configured to transmit data of the measured distance to the robot control device, and the robot control device includes a communication interface configured to receive the data of the measured distance from the wafer-type sensor, and a processor configured to control the transfer robot based on the data of the measured distance data to align a wafer to be subsequently transferred.

Figure 1:
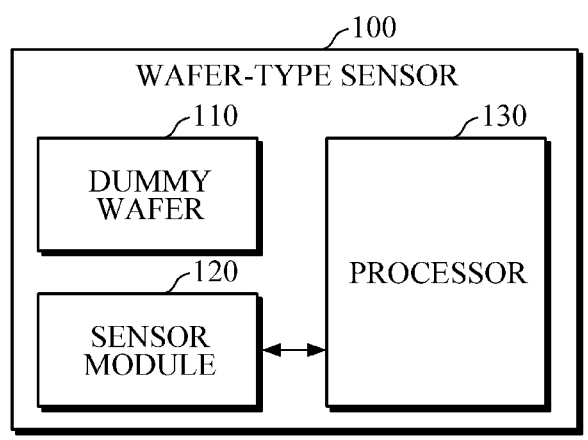
FIG. 1 is a block diagram illustrating a wafer-type sensor according to an embodiment of the present disclosure.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Details of embodiments are included in the following detailed description and drawings. Advantages and features of the present disclosure, and a method of achieving the same will be more clearly understood from the following embodiments described in detail with reference to the accompanying drawings. Throughout the drawings and the detailed description, unless otherwise described, the same drawing reference numerals will be understood to refer to the same elements, features, and structures.

It will be understood that, although the terms first, second, etc. may be used herein to describe various elements, these elements should not be limited by these terms. These terms are only used to distinguish one element from another. Any references to singular may include plural unless expressly stated otherwise. In addition, unless explicitly described to the contrary, an expression such as "comprising" or "including" will be understood to imply the inclusion of stated elements but not the exclusion of any other elements. Also, the terms, such as 'unit' or 'module', etc., should be understood as a unit that performs at least one function or operation and that may be embodied as hardware, software, or a combination thereof.

Figure 2:
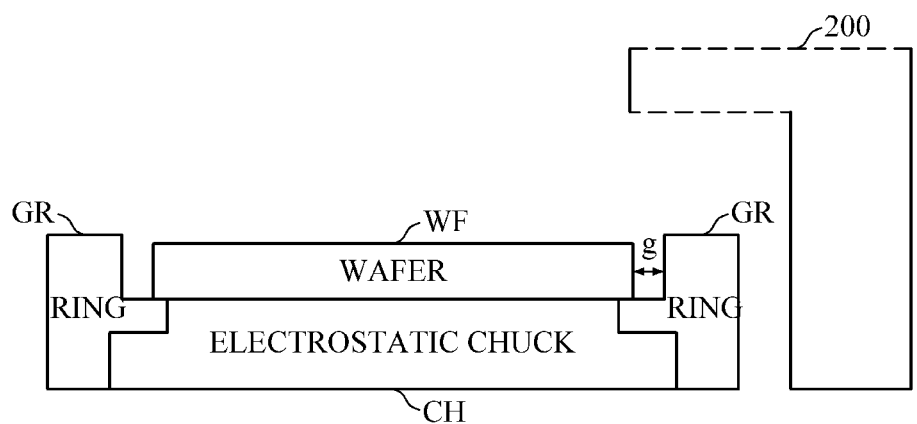
FIG. 2 is a diagram explaining general alignment of a wafer.

FIG. 1 is a block diagram illustrating a wafer-type sensor according to an embodiment of the present disclosure. FIG. 2 is a diagram explaining general alignment of a wafer. FIGS. 3A to 3D are diagrams explaining a structure of a wafer-type sensor according to an embodiment of the present disclosure, and an example of aligning a wafer by using the wafer-type sensor.

Referring to FIG. 1, a wafer-type sensor 100 includes a dummy wafer 110, a sensor module 120, and a processor 130.

The dummy wafer 110 may be manufactured in the same size and shape as a wafer used in semiconductor products. For example, the dummy wafer 110 may be formed to have a diameter of 300 mm. However, the dummy wafer 110 is not limited thereto, and the diameter and thickness of the dummy wafer 110 may be changed to various values as needed. In this case, all or a partial region of the dummy wafer 110 (e.g., a region through which light of the sensor module 120 passes) may be made of a material different from the wafer.

One or more sensor modules 120 may be disposed on an inner side surface of the dummy wafer 110. The sensor module 120 may be a photoelectric proximity sensor. However, the sensor module 120 is not limited thereto and may be replaced with a capacitive proximity sensor or an ultrasonic proximity sensor.

For example, the photoelectric proximity sensor may include a light source for emitting light to an object and a light receiver for detecting light reflected from the object and converting the light into an electrical signal. The light source may include a light emitting diode (LED), a laser diode, a phosphor, and the like. The light source may emit light of a specific wavelength or light of a plurality of wavelengths. For example, the wavelengths may be green, red, blue, and infrared wavelengths, but are not limited thereto. The light receiver may include one or more photodiodes, photo transistors (PTr), or image sensors (e.g., CMOS image sensor), etc., but is not limited thereto.

Referring to FIG. 2, semiconductor substrate processing is generally performed by subjecting a substrate to a plurality of sequential processes on a wafer WF to create devices, conductors and insulators on the substrate. The wafer WF is first mounted on an electrostatic chuck CH by a transfer robot 200. In this case, a ring GR is formed around a periphery of the electrostatic chuck CH and in a shape corresponding to a shape of the wafer WF to guide mounting of the wafer WF and to prevent the wafer WF from being separated from the electrostatic chuck CH during semiconductor manufacturing processes. While the wafer WF is mounted on the electrostatic chuck CH, the wafer WF is spaced from the ring GR by a distance g. The semiconductor manufacturing processes, e.g., the photolithography process, wafer probe and test, wafer mounting, dicing, etc., require highly precise alignment of the wafer WF.

In this embodiment, before the wafer WF is transported by the transfer robot 200, the dummy wafer 110 may be first transported by the transfer robot 200 and placed on the electrostatic chuck CH for alignment of the wafer WF. When the dummy wafer 110 is placed on the electrostatic chuck CH, the sensor module 120 disposed in the dummy wafer 110 may measure a distance between a side edge of the dummy wafer 110 and the ring GR. For example, the light source and the light receiver of the sensor module 120 may be located toward the ring GR, and when the light source emits light to the ring GR, the light receiver may detect light reflected from the ring GR, and the sensor module 120 may measure the distance between the side edge of the dummy wafer 110 and the ring GR. In this case, the side surface of the dummy wafer 100 may be made of a light-transmitting material so that the light emitted by the light source and the light reflected from the ring GR may pass through the side surface of the dummy wafer 100. The measured distance between the side edge of the dummy wafer 110 and the ring GR is used to determine whether the dummy wafer 110 is aligned on the electrostatic chuck CH, and the transfer robot may perform transfer control based on the determination.

Figure 3A:
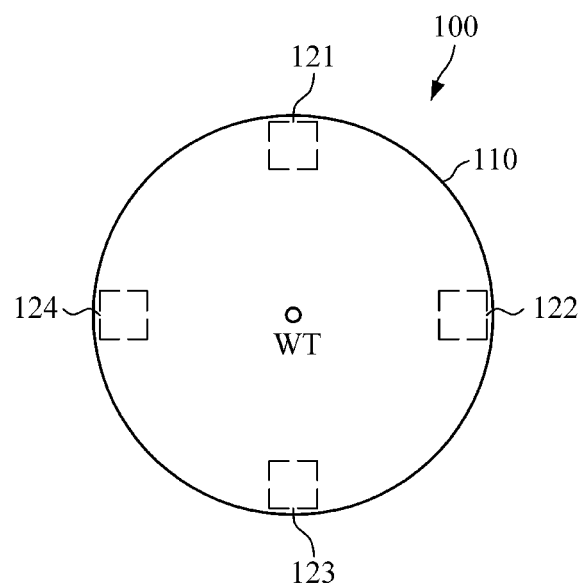
FIGS. 3A to 3D are diagrams explaining a structure of a wafer-type sensor according to an embodiment of the present disclosure, and an example of aligning a wafer by using the wafer-type sensor.

Referring to FIG. 3A, the wafer-type sensor 100 may include four sensor modules 121, 122, 123, and 124 in the dummy wafer 110 to monitor an alignment state of the dummy wafer 110 in transverse and longitudinal directions. However, the wafer-type sensor 100 is not limited thereto, and three or four or more sensor modules may also be disposed in the dummy wafer 110. In this case, the respective sensor modules 121, 122, 123, and 124 may be arranged at equal distances along a circumference of the dummy wafer 110, e.g., the respective sensor modules 121, 122, 123, and 124 may be disposed so that an angle between a center WT and two sensor modules may be equal. In addition, it is also possible that one or two sensor modules may be disposed when the transfer robot has a function of rotating the dummy wafer 110. In the case where one sensor module is disposed, an alignment state in the transverse and longitudinal directions may be monitored by rotating the dummy wafer 110 by 360 degrees, and in the case where two sensor modules are disposed symmetrical to each other, the alignment state in the transverse and longitudinal directions may be monitored by rotating the dummy wafer 110 by 180 degrees.

Figure 3B:
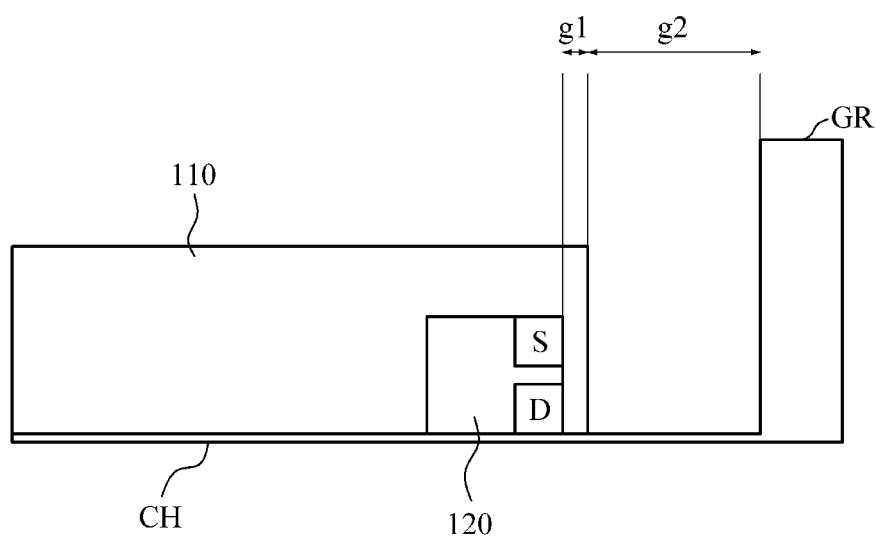

Referring to FIG. 3B, while the dummy wafer 10 is placed on the electrostatic chuck CH and aligned in the transverse and longitudinal directions, the dummy wafer 110 may be designed so that a distance between a side surface of the dummy wafer 110 and the ring GR may be a predetermined distance (e.g. 650 µm). In this case, the distance between the side surface of the dummy wafer 110 and the ring GR may refer to a distance g1+g2 from the sensor module 120 which is inserted at a position as close as possible to a side edge of the dummy wafer 110. If the sensor module 120 is provided in plurality as illustrated in FIG. 3A, the respective sensor modules 121, 122, 123, and 124 may be arranged at equal distances from the ring GR. In addition, while the dummy wafer 110 placed on the electrostatic chuck CH is not aligned, the sensor module 120 may be disposed so that a distance between the side surface of the dummy wafer 110 and the ring GR is within a predetermined range (e.g., 350 µm to 900 µm). In this case, an emission angle and an acceptance angle of a light source S and a light receiver D may be predetermined angles, and a distance between the light source S and the light receiver D may be in a predetermined range (e.g., 500 µm to 1500 µm).

Figure 3C:
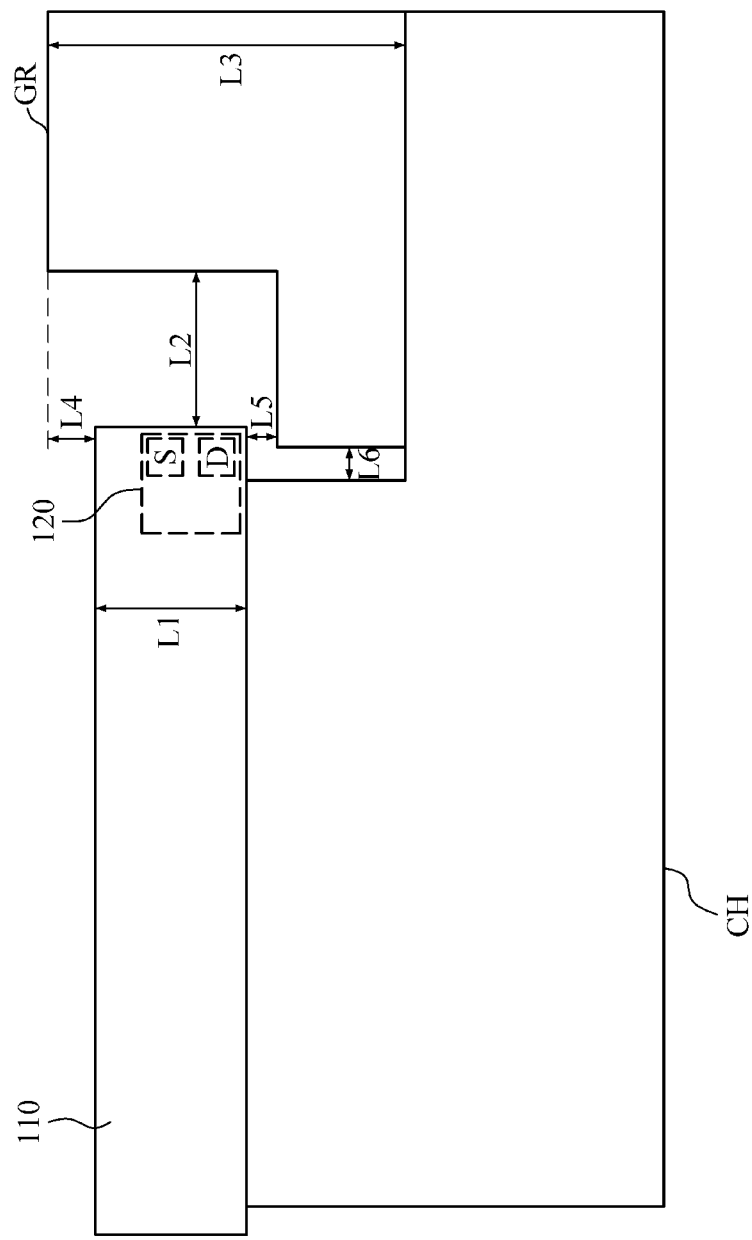

FIG. 3C is a diagram illustrating an example of arrangement of the dummy wafer 110, the electrostatic chuck CH, and the ring GR. Referring to FIG. 3C, when the dummy wafer 110 designed to have a predetermined thickness L1 is aligned on the electrostatic chuck CH, a distance between the side surface of the dummy wafer 110 and a surface of the ring GR that faces the side surface of the dummy wafer 110 may be designed to be a predetermined distance L2. For example, in the case where the dummy wafer 110 has a diameter of 300 µm, the distance L2 may be designed to be 650 µm, but is not limited thereto. In addition, to effectively guide the wafer on the electrostatic chuck CH, a height L3 of the ring GR may be designed so that a top surface of the ring GR is positioned above a top surface of the dummy wafer 110 by a predetermined distance L4. Further, a distance between a bottom surface of the dummy wafer 110 and a surface of the ring GR that faces the bottom surface and a distance between the electrostatic chuck CH and a surface of the ring GR that faces the electrostatic chuck CH may be designed to be predetermined distances L5 and L6. However, the arrangement is not limited thereto, and values, shapes, and the like may be changed as needed.

Referring back to FIG. 1, the processor 130 may be disposed in the dummy wafer 110. The processor 130 may be electrically connected to the sensor module 120 to control the sensor module 120. For example, when the dummy wafer 110 is placed on the electrostatic chuck CH, the processor 130 may operate the light source according to predefined operating conditions of the sensor module 120 (e.g., current intensity and/or duration of the light source, etc.). In addition, the processor 130 may control the light receiver and may perform various processing operations for wafer alignment by using distance data received from the light receiver.

Figure 3D:
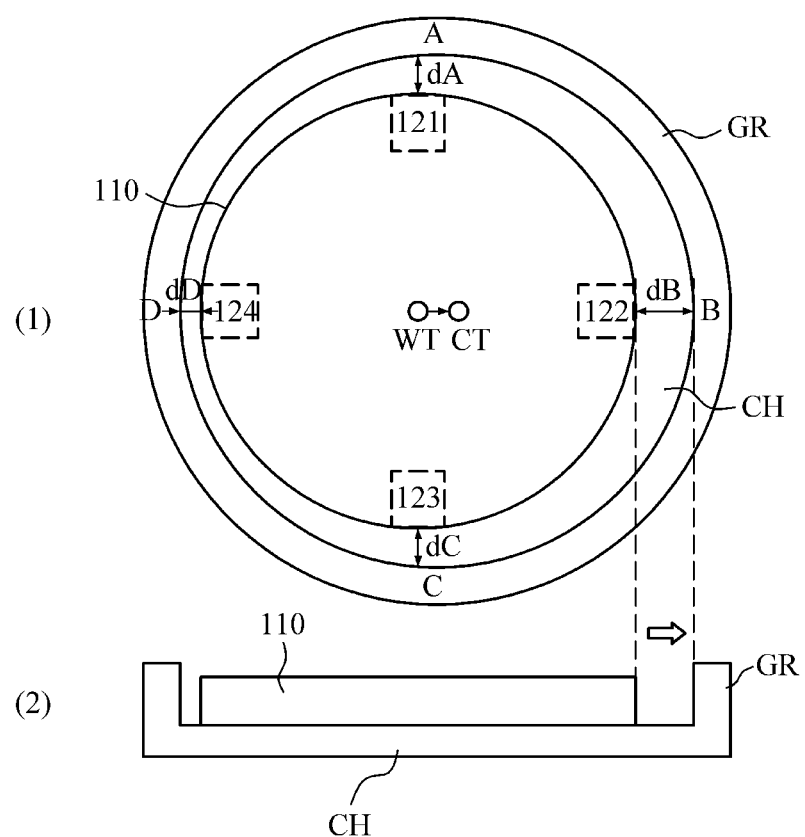

For example, the processor 130 may calculate a transfer control value of the transfer robot for wafer alignment by using the received distance data. For example, FIG. 3D illustrates an example in which the center WT of the dummy wafer 110 is biased to the left from a center CT of the electrostatic chuck CH. In the embodiment, the dummy wafer 110 may include the sensor modules 121, 122, 123, and 124 as in FIG. 3A where the sensor modules 122 and 124 are traverse sensor modules and the sensor modules 121 and 123 are longitudinal sensor modules.

When the dummy wafer 110 is placed on the electrostatic chuck CH, the processor 130 may operate the light sources of the respective sensor modules 121, 122, 123, and 124 to emit light to the respective surfaces A, B, C, and D disposed to face the ring GR. In this case, the processor 130 may simultaneously operate all the sensor modules 121, 122, 123, and 124 or may sequentially operate the respective sensor modules 121, 122, 123, and 124 in a predetermined order. Alternatively, the processor 130 may simultaneously operate the transverse sensor modules 122 and 124, and then simultaneously operate the longitudinal sensor modules 121 and 123, or vice versa.

In addition, the processor 130 may receive light intensity data detected by the light receivers of the respective sensor modules 121, 122, 123, and 124 and may obtain, as distance data dA, dB, dC, and dD, the received light intensity data or data converted by scaling the data and/or removing noise from the data, and the like. By using the obtained distance data dA, dB, dC, and dD, the processor 130 may calculate the transfer control value for the transfer robot so that the distances dA, dB, dC, and dD may be equal in all directions. For example, the processor 130 may calculate the transfer control value so that a distance difference dB−dD in the transverse direction may become zero, and a distance difference dA−dC in the longitudinal direction may become zero, as shown in the following Equation 1.

$$\Delta x = f(dB-dD)$$
$$\Delta y = g(dA-dC) \quad \text{[Equation 1]}$$

Herein, $\Delta x$ denotes the transfer control value in the transverse direction, $\Delta y$ denotes the transfer control value in the longitudinal direction, and f and g denote functions defined for each transfer robot to calculate the transfer control values in the transverse and longitudinal directions by using the distance differences in each of the transverse and longitudinal directions as inputs.

The processor 130 may transmit, through a communication interface, the calculated transfer control value to a robot control device for controlling the transfer robot. Here, the robot control device may be a device mounted in the transfer robot or connected by wire or wirelessly to the transfer robot to control the operation of the transfer robot. Upon receiving the transfer control value, the robot control device may set the value for the transfer robot so that the transfer robot may transfer wafers to the electrostatic chuck CH according to the set transfer control value.

In addition, in the case where the robot control device includes a transfer control value calculation algorithm, the processor 130 may transmit the distance data received from the sensor modules 121, 122, 123, and 124 to the robot control device. In this case, the robot control device may calculate the transfer control value for the transfer robot by using the distance data received from the processor 130 and may control the transfer robot.

Furthermore, if calibration conditions are satisfied, the processor 130 may calibrate the sensor modules. If the sensor modules are used for a long time or used in various environments including ambient temperature and humidity, etc., performance of the sensor modules may be changed compared to the performance of a standard sensor module at the time of manufacture. For example, an output of the light source may be reduced compared to the standard light source, or a detection intensity of the light receiver may be reduced. In this case, the calibration conditions may be set, for example, so that calibration is performed automatically when the wafer-type sensor 100 is held in a calibration device. However, the calibration conditions are not limited thereto, and may be set so that calibration is performed during charging while the wafer-type sensor 110 is held in the calibration device, at predetermined intervals, and/or in response to a user's request.

The processor 130 may calibrate the sensor module, for example, so that the performance of the sensor module corresponds to the performance of the standard sensor module. Alternatively, if there are a plurality of sensor modules, the processor 130 may calibrate the sensor modules so that sensing values of the respective sensor modules, e.g., light intensities detected by the light receivers, may be equal to each other. For example, the processor 130 may operate the light source of the sensor module 120 to emit light to the reflector provided in the calibration device, and may adjust a current intensity and/or a duration of the light source, and the like so that the light intensity detected by the light receiver may have a reference value set at the time of manufacture. Alternatively, if there are a plurality of sensor modules, the processor 130 may adjust a current intensity and/or a duration of the light source of the respective sensor modules so that the light intensities detected by the light receiver of the respective sensor modules may have an average value, a maximum value, and a minimum value of the light intensities of all the sensor modules, or a reference value.

In this embodiment, a wafer alignment process using the wafer-type sensor 100 may be performed once at the beginning of the process for the same transfer robot before a wafer is actually transported. When the transfer robot is changed for another process, the wafer alignment process may be performed again for the changed transfer robot. However, the wafer alignment process is not limited thereto, and even when the wafer alignment process is performed for the same transfer robot, the number of times of wafer alignment, a wafer alignment time, and the like may be predetermined by considering various environment conditions such as the number of transported wafers, elapsed operating time, and the like.

Figure 4:
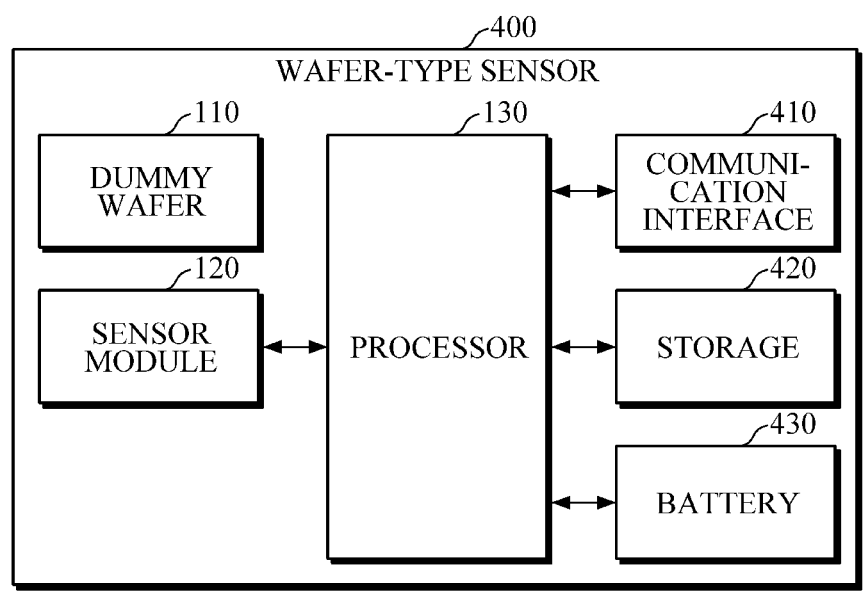
FIG. 4 is a block diagram illustrating a wafer-type sensor according to another embodiment of the present disclosure.

FIG. 4 is a block diagram illustrating a wafer-type sensor according to another embodiment of the present disclosure.

Referring to FIG. 4, a wafer-type sensor 400 according to another embodiment includes the dummy wafer 110, the sensor module 120, the processor 130, a communication interface 410, a storage 420, and a battery 430. The dummy wafer 110, the sensor module 120, and the processor 130 are described in detail above and thus a description thereof will be omitted.

The communication interface 410 may be disposed in the dummy wafer 110 and may be electrically connected to the processor 130. Under the control of the processor 130, the communication interface 410 may transmit distance data and/or a transfer control value for a transfer robot to a robot control device by using various communication techniques. In addition, when a new transfer robot is added to the robot control device, or transfer conditions of an existing transfer robot are changed, the communication interface 410 may receive data required for calculating a transfer control value for the corresponding transfer robot (e.g., information on the new transfer robot, a transfer control value calculation function as shown in Equation 1, etc.).

In this case, the communication techniques may include Bluetooth communication, Bluetooth Low Energy (BLE) communication, Near Field Communication (NFC), WLAN communication, Zigbee communication, Infrared Data Association (IrDA) communication, Wi-Fi Direct (WFD) communication, Ultra-Wideband (UWB) communication, Ant+ communication, WIFI communication, Radio Frequency Identification (RFID) communication, 3G, 4G, and 5G communications, and the like.

The storage 420 may be disposed in the dummy wafer 110 and may store data processed by the sensor module 120 and/or the processor 130 (e.g., distance data, transfer control values, calibration values of the sensor module, etc.). Further, the storage 420 may store data received from the robot control device via the communication interface 410 (e.g., transfer robot information, transfer control value calculation function, etc.). In addition, the storage 420 may store one or more instructions executable by the processor 130 to control the components of the wafer-type sensor.

The storage 420 may include at least one storage medium of a flash memory type memory, a hard disk type memory, a multimedia card micro type memory, a card type memory (e.g., an SD memory, an XD memory, etc.), a Random Access Memory (RAM), a Static Random Access Memory (SRAM), a Read Only Memory (ROM), an Electrically Erasable Programmable Read Only Memory (EEPROM), a Programmable Read Only Memory (PROM), a magnetic memory, a magnetic disk, and an optical disk, and the like, but is not limited thereto.

The battery 430 may be disposed in the dummy wafer 110 and may supply power to components of the wafer-type sensor 400. The battery 430 may include a primary battery which is not rechargeable, a secondary battery which is rechargeable, and/or a fuel cell. The battery 430 may be charged when the wafer-type sensor 400 is held in a charging device of the wafer-type sensor 400, for example, in a calibration device having a charging function. In this case, although not illustrated herein, the dummy wafer 110 may include a separate component such as a charging terminal, a charging coil, etc., for wired or wireless charging of the battery 430.

Figure 5A:
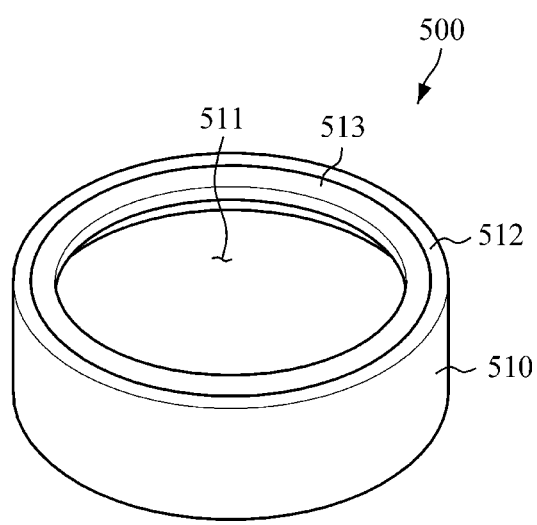
FIGS. 5A and 5B are diagrams schematically illustrating a structure of a calibration device according to an embodiment of the present disclosure, and an example of calibrating a wafer-type sensor.
Figure 5B:
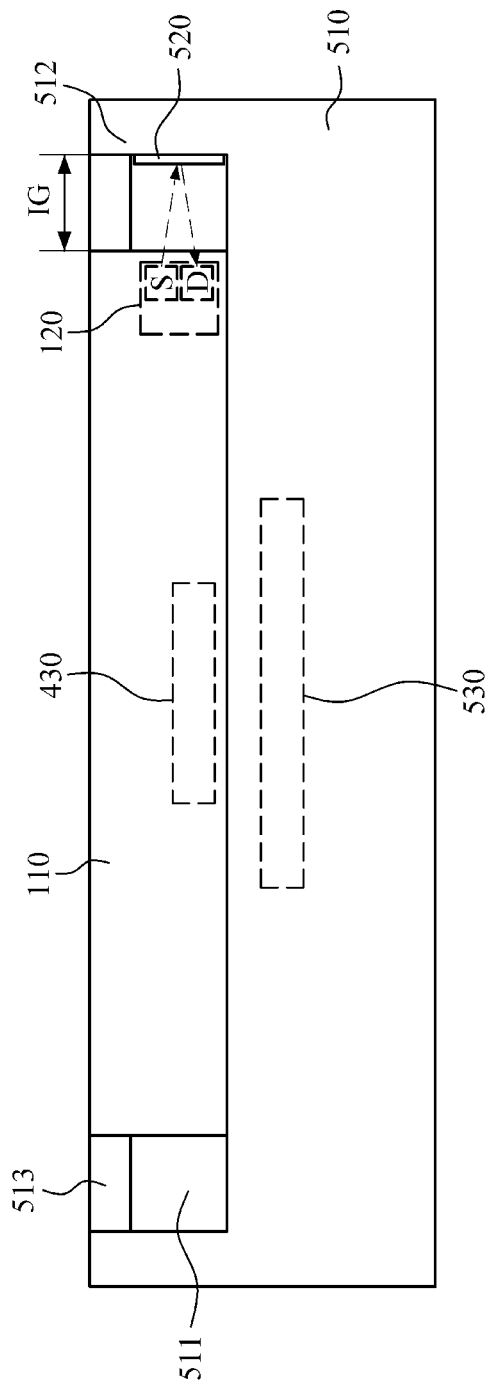

FIGS. 5A and 5B are diagrams schematically illustrating a structure of a calibration device according to an embodiment of the present disclosure, and an example of calibrating sensor modules of the wafer-type sensors 100 and 400.

Referring to FIGS. 5A and 5B, a calibration device 500 according to an embodiment includes a housing 510 having a receiving space 511 so that the dummy wafer 11 of the wafer-type sensors 100 and 400 may be received and held in the calibration device 500. A side support part 512 of the housing 510 having the receiving space 511 may be formed in a ring shape corresponding to a shape of the circumference of the dummy wafer 110. In this case, a distance IG between the side support part 512 and the side surface of the dummy wafer 110 may be formed to be equal to the distance between the side surface of the dummy wafer 110 and the ring GR while the dummy wafer 110 is aligned, as shown in FIG. 3A.

The calibration device 500 may further include a reflector 520. The reflector 520 may be formed on a surface of the side support part 512 that faces the side surface of the dummy wafer 110 (hereinafter referred to as a "reflecting surface"). For example, the reflector 520 may be a reference material applied to the reflecting surface. In this case, the reference material may be a diffuse reflection material having a reflectivity of 1% to 99%, and may include barium sulfate (BaSo4), Teflon (Polytetrafluoroethylene (PTFE)), and the like. The reflector 520 may be formed on the entire reflecting surface of the side support part 512 so that the dummy wafer 110 may be held in the receiving space 511 regardless of an arrangement position of the sensor module 120. Alternatively, if a direction in which the dummy wafer 110 is held is predetermined according to the arrangement position of the sensor module 120, the reflector 520 may be formed only on the reflecting surface disposed opposite the position of the sensor module 120.

In addition, the calibration device 500 may further include a spacer 513 located toward the center of the receiving space 511 from the reflecting surface of the side support part 512. In this case, the spacer 513 may include a spacer jig, but is not limited thereto. When the dummy wafer 110 is mounted in the receiving space 511, the spacer 513 may provide alignment by maintaining a predetermined distance IG from the side surface of the dummy wafer 110 to the reflector of the side support part 512.

In addition, the calibration device 500 may further include a charger 530 disposed in the housing 510. When the dummy wafer 110 is inserted into the receiving space 511, the charger 530 may be disposed on a surface of the housing on which the dummy wafer 110 is mounted, or at a position in the housing 510 which is adjacent to the surface of the housing. The charger 530 may include a charging terminal, a charging coil, etc., for wired or wireless charging. When the dummy wafer 110 is mounted in the receiving space 511, the charger 530 may charge the battery 430 mounted in the dummy wafer 110.

Although not illustrated herein, the calibration device 500 may further include a communication interface for data transmission. When the dummy wafer 110 is mounted in the receiving space 511, the communication interface may communicate with the communication interface 410 mounted in the dummy wafer 110 to transmit and receive data.

Further, the processor 130 of the wafer-type sensors 100 and 400 may detect whether the dummy wafer 110 is held in the calibration device 500. Upon detecting that the dummy wafer 110 is held in the calibration device 500, the processor 130 may automatically perform calibration of the sensor module 120 according to a setting. The processor 130 may operate a light source S and a light receiver D according to set operating conditions, to emit light to the reflector 520 and to detect light reflected from the reflector 520. As described above, when the dummy wafer 110 is aligned in the receiving space 511 of the calibration device 500, such that distances between the respective sensor modules 120 and the reflector 520 are equal, sensing values of the respective sensor modules 120 should be equal to each other. However, the sensing values may be changed due to a reduction in performance of the sensor modules 120 and the like, such that the processor 130 may calculate the respective sensor modules 120 so that the sensor modules 120 may have the same sensing value, as described above.

Figure 6:
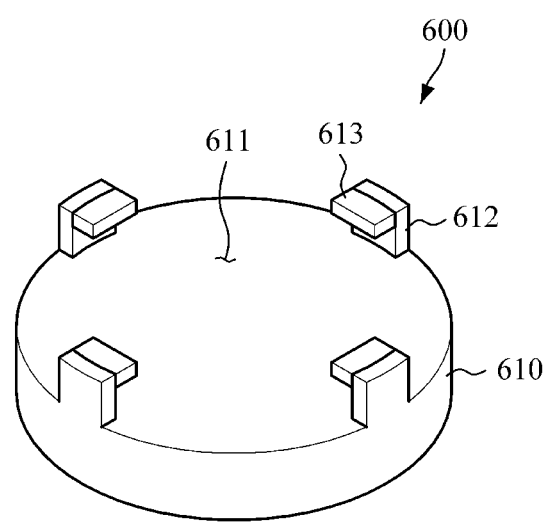
FIG. 6 is a diagram schematically illustrating a structure of a calibration device according to another embodiment of the present disclosure.

FIG. 6 is a diagram schematically illustrating a structure of a calibration device according to another embodiment of the present disclosure.

Referring to FIG. 6, as in the calibration device 500 of FIG. 5, a calibration device 600 includes a housing 610 having a receiving space 611 in which the dummy wafer 110 of the wafer-type sensors 100 and 400 is received. In addition, unlike the calibration device 500 of FIG. 5, a side support part 612 of the housing having the receiving space 611 may be formed in a columnar shape at a position facing the sensor module 120, so as to correspond to the sensor module 120 when the dummy wafer 110 is held in the receiving space 611. A reflector for calibrating the sensor module 120 may be formed on a reflecting surface of the side support part 612 that faces the sensor module 120. In addition, the calibration device 600 may include a spacer 613 which is connected to the side support part 612 and located toward the center of the receiving space 611 from the side support part 612, and provides alignment by maintaining a predetermined distance from all the sensor modules 120 to the reflector of the side support part 612. The side support part 612 and the spacer 613 are provided in plurality to form a plurality of side support parts 612 and a plurality of spacers 613 in the calibration device 600.

Figure 7:
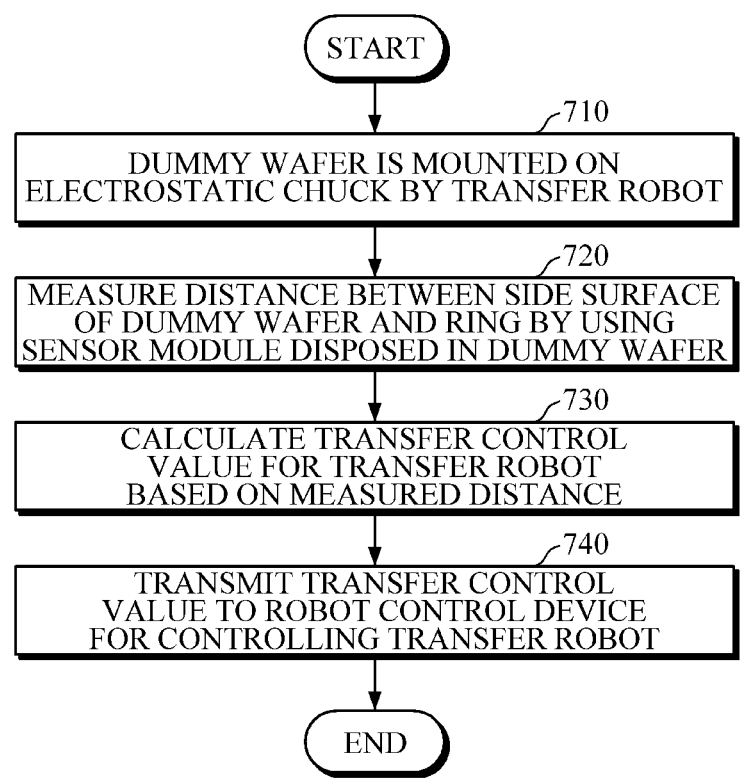
FIG. 7 is a flowchart illustrating a wafer alignment method according to an embodiment of the present disclosure.

FIG. 7 is a flowchart illustrating a wafer alignment method according to an embodiment of the present disclosure.

FIG. 7 shows an example of a wafer alignment method performed by the wafer-type sensors 100 and 400 of FIG. 1 or FIG. 4, which will be briefly described below.

First, the dummy wafer of the wafer-type sensors 100 and 400 is mounted on the electrostatic chuck by the transfer robot in 710. Then, the wafer-type sensor may measure a distance between the side surface of the dummy wafer and the ring by using the sensor module disposed in the dummy wafer in 720.

Then, the wafer-type sensor may calculate a transfer control value for the transfer robot in 730 based on the distance measured in 720. As described above, the wafer-type sensor may calculate the transfer control value so that a distance difference measured on both sides in the transverse direction may become zero, and a distance difference measured on both sides in the longitudinal direction may become zero.

Subsequently, the wafer-type sensor may transmit the transfer control value to the robot control device for controlling the transfer robot in 740. The robot control device may set the received transfer control value for the transfer robot to control the transfer robot.

Figure 8:
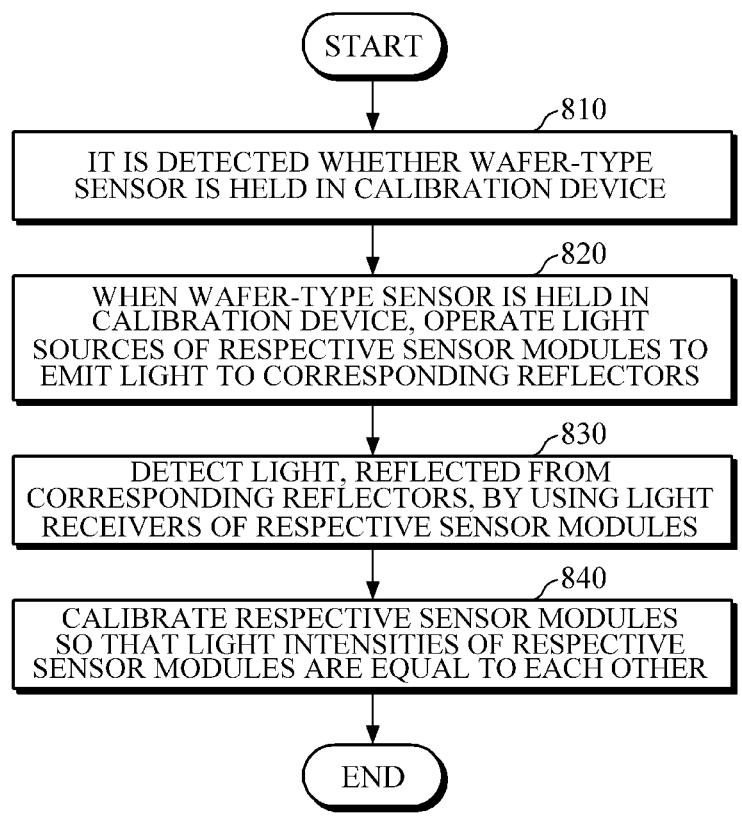
FIG. 8 is a flowchart illustrating a method of calibrating a wafer-type sensor according to an embodiment of the present disclosure.

FIG. 8 is a flowchart illustrating a method of calibrating a wafer-type sensor according to an embodiment of the present disclosure.

FIG. 8 shows an example of a method of calibrating a wafer-type sensor performed by the wafer-type sensors 100 and 400 of FIG. 1 or FIG. 4, which will be briefly described below.

First, it is detected whether the wafer-type sensor is held in the calibration device in 810.

Then, when the wafer-type sensor is held in the calibration device, the wafer-type sensor may operate the light sources of the respective sensor modules to emit light to corresponding reflectors of the calibration device in 820.

Subsequently, the wafer-type sensor may detect light reflected from the corresponding reflectors by using the light receivers of the respective sensor modules in 830.

Next, the wafer-type sensor may calibrate the respective sensor modules so that light intensities of the respective sensor modules may be equal to each other in 840. For example, the wafer-type sensor may calibrate the sensor modules so that light intensities of all the sensor modules may have an initially set reference value or may have an average value, a median value, a minimum value, or the like of the light intensities.

Figure 9:
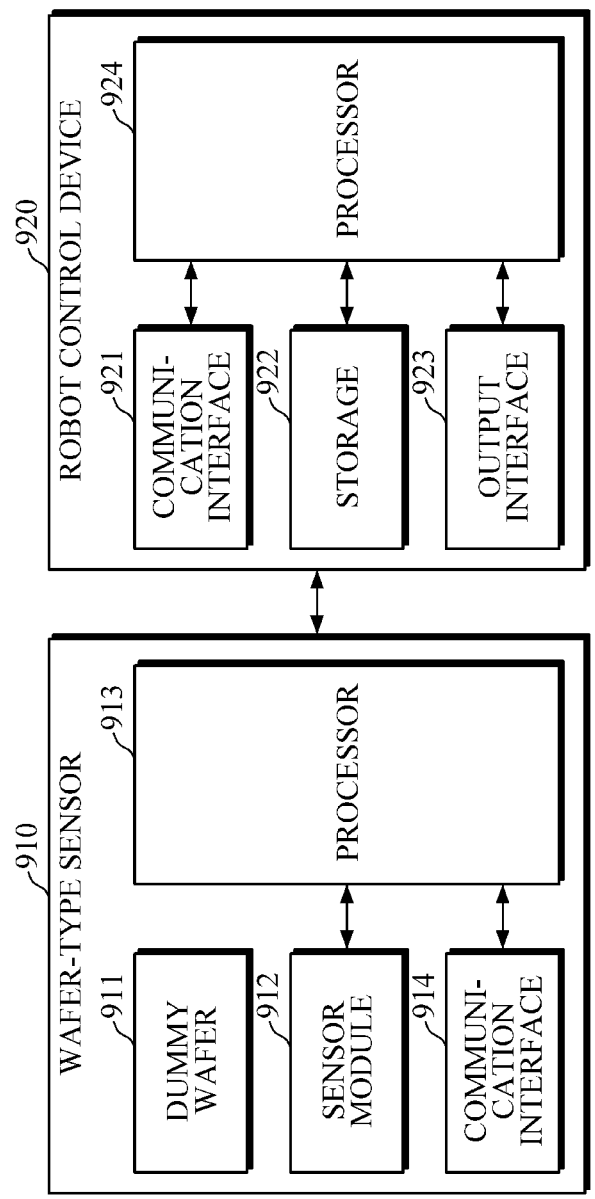
FIG. 9 is a block diagram illustrating a wafer alignment device according to an embodiment of the present disclosure.

FIG. 9 is a block diagram illustrating a wafer alignment device according to an embodiment of the present disclosure.

Referring to FIG. 9, a wafer alignment device includes a wafer-type sensor 910 and a robot control device 920.

The wafer-type sensor 910 includes a dummy wafer 911, a sensor module 912, a processor 913, and a communication interface 914. In addition, as illustrated in FIG. 4, the wafer-type sensor 910 may further include a storage and/or a battery. The dummy wafer 911, the sensor module 912, the processor 913, and the communication interface 914 are described above and thus a detailed description thereof will be omitted.

The robot control device 920 includes a communication interface 921, a storage 922, an output interface 923, and a processor 924. The storage 922 and the output interface 923 may be selectively omitted if necessary, and the robot control device 920 may further include various additional components not illustrated herein. The robot control device 920 may be mounted in the transfer robot, or may be provided as a separate device from the transfer robot to control the transfer robot via wired and wireless communication with the transfer robot.

The communication interface 921 of the robot control device 920 may communicate with the communication interface 914 of the wafer-type sensor 910 to transmit and receive necessary data. For example, the communication interface 921 may receive distance data and/or a transfer control value from the communication interface 914 of the wafer-type sensor 910. In addition, when connected with the transfer robot via wired or wireless communication, the communication interface 921 may transmit a transfer control value to the transfer robot.

The processor 924 of the robot control device 920 may calculate a transfer control value by using the distance data received from the wafer-type sensor 910. The processor 924 may control the transfer robot by setting the calculated transfer control value or the transfer control value received from the wafer-type sensor 910 for the transfer robot or by transmitting the value to the transfer robot. In addition, the processor 924 may store the distance data, the transfer control value, and/or a monitoring result of the transfer robot in the storage 922, and may provide the data to a user through the output interface 923.

The present disclosure can be realized as a computer-readable code written on a computer-readable recording medium. The computer-readable recording medium may be any type of recording device in which data is stored in a computer-readable manner. According to an embodiment of the present disclosure, the computer-readable recording medium may be provided in a form of a non-transitory storage medium Here, the 'non-transitory storage medium' only denotes a tangible device and does not contain a signal (for example, electromagnetic waves). This term does not distinguish a case where data s stored in the recording medium semi-permanently and a case where the data is stored in the recording medium temporarily. For example, the 'non-transitory recording medium' may include a buffer where data is temporarily stored.

Examples of the computer-readable recording medium include a ROM, a RAM, a CD-ROM, a magnetic tape, a floppy disc, an optical data storage, and a carrier wave (e.g., data transmission through the Internet). The computer-readable recording medium can be distributed over a plurality of computer systems connected to a network so that a computer-readable code is written thereto and executed therefrom in a decentralized manner. Functional programs, codes, and code segments needed for realizing embodiments of the disclosure can be readily deduced by programmers of ordinary skill in the art to which the disclosure pertains.

The present disclosure has been described herein with regard to example embodiments. However, it will be obvious to those skilled in the art that various changes and modifications can be made without changing technical conception and essential features of the present disclosure. Thus, it is clear that the above-described embodiments are illustrative in all aspects and are not intended to limit the present disclosure.

What is claimed is:

1. A wafer-type sensor comprising:
   a dummy wafer;
   a plurality of sensor modules disposed in the dummy wafer; and
   a processor configured to control each of the plurality of sensor modules to measure a distance between a side surface of the dummy wafer and a ring formed around a periphery of an electrostatic chuck while the dummy wafer is mounted on the electrostatic chuck by a transfer robot,
   wherein the processor is further configured to:
      control each of the plurality of sensor modules to measure a first distance between the side surface of the dummy wafer and the ring, and
      control each of the plurality of sensor modules to measure a second distance between the side surface of the dummy wafer and the ring after the first distance is measured and the dummy wafer mounted on the electrostatic chuck is rotated by a predetermined degree by the transfer robot.

2. The wafer-type sensor of claim 1, wherein each of the plurality of sensor modules comprises:
   a light source configured to emit light to the ring; and
   a light receiver configured to detect light reflected from the ring.

3. The wafer-type sensor of claim 2, wherein a distance between the light source and the light receiver of each of the plurality of sensor modules is 500 μm to 1500 μm.

4. The wafer-type sensor of claim 1, wherein the plurality of sensor modules are disposed in the dummy wafer so that distances between the respective sensor modules and the ring are equal while the dummy wafer is aligned.

5. The wafer-type sensor of claim 1, wherein the dummy wafer is placed on the electrostatic chuck, and each of the plurality of sensor modules is disposed so that a distance between each of the plurality of sensor modules and the ring is in a predetermined range.

6. The wafer-type sensor of claim 1, wherein the plurality of sensor modules are arranged at equal distances along a circumference of the dummy wafer.

7. The wafer-type sensor of claim 1, wherein the processor calculates a transfer control value for the transfer robot based on the measured distance.

8. The wafer-type sensor of claim 7, further comprising a communication interface configured to transmit the calculated transfer control value to a robot control device for controlling the transfer robot.

9. The wafer-type sensor of claim 1, wherein the wafer-type sensor is held in a calibration device, and the processor calibrates the plurality of sensor modules by using a plurality of reflectors provided in the calibration device.

10. The wafer-type sensor of claim 9, wherein the processor operates a light source of each of the plurality of sensor modules to emit light to a corresponding reflector of the plurality of reflectors, and calibrates the plurality of sensor modules so that light intensities detected by light receivers of the plurality of sensor modules are equal to each other.

11. The wafer-type sensor of claim 10, wherein the processor adjusts at least one of a current intensity or a duration of the light source so that the light intensities detected by the light receivers of the plurality of sensor modules have one of an average value, a maximum value, and a minimum value of the detected light intensities, or a predefined reference value.

12. The wafer-type sensor of claim 1, further comprising a storage configured to store at least one of a processing result of the processor and an operating condition of each of the plurality of sensor modules.

13. The wafer-type sensor of claim 1, further comprising a battery configured to supply power to each of the plurality of sensor modules.

14. A wafer alignment method using a wafer-type sensor including a dummy wafer, the method comprising:
   measuring, by each of a plurality of sensor modules disposed in the dummy wafer, a distance between a side surface of the dummy wafer and a ring formed around a periphery of an electrostatic chuck while the dummy wafer is mounted on the electrostatic chuck by a transfer robot; and
   controlling the transfer robot based on the measured distance to align a wafer to be subsequently transferred,
   wherein the measuring of the distance comprises:
   measuring, by each of the plurality of sensor modules, a first distance between the side surface of the dummy wafer and the ring, and
   measuring, by each of the plurality of sensor modules, a second distance between the side surface of the dummy wafer and the ring after the first distance is measured and the dummy wafer mounted on the electrostatic chuck is rotated by a predetermined degree by the transfer robot.

15. The method of claim 14, wherein the controlling of the transfer robot comprises:
   calculating a transfer control value for the transfer robot based on the measured distance; and
   transmitting the calculated transfer control value to a robot control device for controlling the transfer robot.

16. The method of claim 14, further comprising calibrating the plurality of sensor modules by using a plurality of reflectors provided in a calibration device while the wafer-type sensor is held in the calibration device.

17. The method of claim 16,
   wherein the calibrating of the plurality of sensor modules comprises:
   operating a light source of each of the plurality of sensor modules to emit light to a corresponding reflector of the plurality of reflectors;
   detecting light by a light receiver of each of the plurality of sensor modules; and
   calibrating the plurality of sensor modules so that light intensities detected by light receivers of the plurality of sensor modules are equal to each other.

18. A wafer alignment device comprising a wafer-type sensor and a robot control device,
   wherein the wafer-type sensor comprises a dummy wafer, a plurality of sensor modules disposed in the dummy wafer, each of the plurality of sensor modules being configured to measure a distance between a side surface of the dummy wafer and a ring formed around a periphery of an electrostatic chuck while the dummy wafer is mounted on the electrostatic chuck by a transfer robot, and a communication interface configured to transmit data of the measured distance to the robot control device, and
   wherein the robot control device comprises a communication interface configured to receive the data of the measured distance from the wafer-type sensor, and a processor configured to control the transfer robot based on the data of the measured distance data to align a wafer to be subsequently transferred,
   wherein the wafer-type sensor is further configured to:
   control each of the plurality of sensor modules to measure a first distance between the side surface of the dummy wafer and the ring, and
   control each of the plurality of sensor modules to measure a second distance between the side surface of the dummy wafer and the ring after the first distance is measured and the dummy wafer mounted on the electrostatic chuck is rotated by a predetermined degree by the transfer robot.

* * * * *